United States Patent [19]

Kobayashi

[11] Patent Number: 4,608,138

[45] Date of Patent: Aug. 26, 1986

[54] ELECTROLYTIC METHOD AND APPARATUS

[75] Inventor: Minoru Kobayashi, Amagasaki, Japan

[73] Assignee: Mitsubishi Denki Kabushiki Kaisha, Tokyo, Japan

[21] Appl. No.: 701,219

[22] Filed: Feb. 13, 1985

[30] Foreign Application Priority Data

Feb. 16, 1984 [JP] Japan .................................. 59-28199
Dec. 20, 1984 [JP] Japan .................................. 59-268934

[51] Int. Cl.$^4$ ....................... B23H 3/02; C25D 17/06; C25F 3/02
[52] U.S. Cl. ........................... 204/129.3; 204/129.43; 204/228; 204/297 R; 204/DIG. 9
[58] Field of Search ............ 204/228, DIG. 9, 129.43, 204/297 R, 129.3

[56] References Cited

U.S. PATENT DOCUMENTS 3,886,053 5/1975 Leland ...................... 204/DIG. 9 X
4,283,259 8/1981 Melcher et al. ................... 204/129.3
4,369,099 1/1983 Kohl et al. ............... 204/DIG. 9 X

FOREIGN PATENT DOCUMENTS 5243769 5/1972 Japan ............................ 204/DIG. 9
633938 11/1978 U.S.S.R. ....................... 204/DIG. 9

*Primary Examiner*—Donald R. Valentine
*Attorney, Agent, or Firm*—Becker & Shur Lowe, Price, Leblanc

[57] ABSTRACT

An electrolytic apparatus for applying a voltage to a workpiece (1) and a counter electrode (5) both immersed in an electrolyte (3) contained in a vessel (4) thereby processing the workpiece (1) comprises a voltage source (15, 15') for applying voltage between the workpiece (1) and the counter electrode (5) in the form of pulses whose polarity is periodically changed, a beam generator (16) for irradiating a subsidiary energy beam (17) on a selected region of the workpiece (17) by generating the beam (17) in the form of periodic pulses and a timing control device (21) for synchronizing the periods of the voltage pulses and the beam pulses.

11 Claims, 13 Drawing Figures

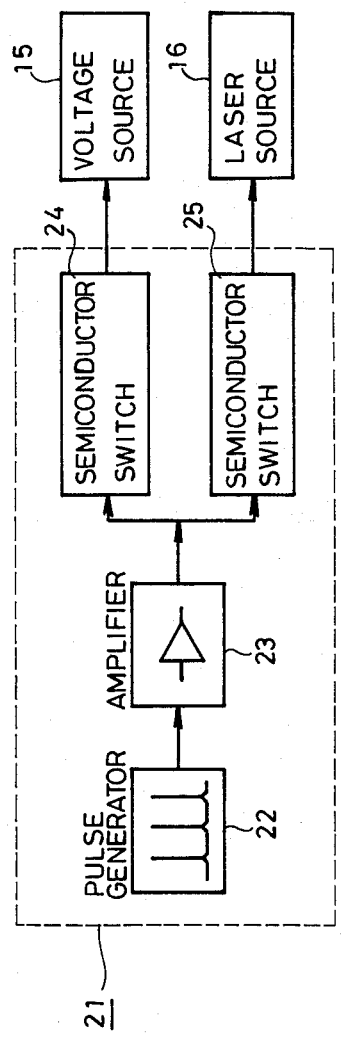
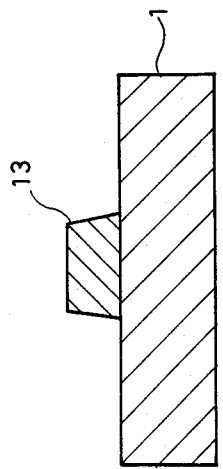

ELECTROLYTIC METHOD AND APPARATUS

BACKGROUND OF THE INVENTION

1. Field of the Invention

The present invention relates to an electrolytic apparatus, and more particularly, it relates to an electrolytic apparatus employing subsidiary energy beams such as laser beams.

2. Description of the Prior Art

Examples of such conventional electrolytic apparatus can be seen in Japanese Patent Laying-Open Gazette No. 38235/1979 and U.S. Pat. No. 4,217,183. FIG. 1 shows an electrolytic apparatus disclosed in the above U.S. patent. Referring to FIG. 1, a metal layer 1 evaporated on an insulated substrate 2 forms a cathode. The cathode 1 is immersed with an anode 5 in an electrolyte 3 prepared as a plating solution of, e.g., cupric sulfate ($CuSO_4$) contained in a vessel 4. A voltage modulator 7 is adapted to modulate voltage supplied between the cathode 1 and the anode 5 by a voltage source 6. The beam emitted from a beam generator 8 (laser source in this case) is modulated by the beam modulator 9 to be focused on the surface of the cathode 1 by a lens 11. The beam 10 is so manipulated by a scanning mirror 12 that a predetermined portion of the cathode 1 is exposed.

FIG. 2A shows the beam pulse waveform modulated by the beam modulator 9. FIG. 2B shows the voltage pulse waveform modulated by the voltage modulator 7 corresponding to the beam pulses shown in FIG. 2A, which is shown by the potential of the cathode 1 with respect to the anode 5.

Operation of the apparatus shown in FIG. 1 is now described. First, as shown in FIG. 2B, prescribed negative voltage pulses are applied to the cathode 1. In this case, the value of the electrolytic current is by far smaller than that for plating the whole surface of the metal layer 1. In such a condition, laser pulses whose periods are synchronized by the beam modulator 9 with those of the voltage pulses shown in FIG. 2B are applied to a predetermined position on the surface of the cathode 1 through the lens 11 and the scanning mirror 12. In this case, the laser beam is selected from the lasers of argon (Ar), krypton (Kr) and YAG etc. to have wavelength which can be transmitted through the electrolyte 3. The portion exposed by the laser beam 10 is electrochemically activated to be selectively and preferentially plated.

FIG. 3 shows portions 13 and 14 of a plated layer on the cathode 1 as plated in the aforementioned manner in a sectional view. The plated layer portion 13 corresponds to the region exposed by the laser beam 10, in which plating is selectively and preferentially facilitated. However, when the voltage pulses are applied, the region 14 not exposed by the laser beam 10 is also slightly plated. In electrolytic plating, further, when the ionization tendency of the metal layer 1 is stronger than that of metal ion in the electrolyte 3 as in the case silver (Ag) is plated on a cathode of copper (Cu) or nickel (Ni) etc., displacement plating is caused on the whole surface of the metal layer 1 by simply immersing the same in the electrolyte 3. As the result, the thinner plated layer 14 is formed on the region not exposed by the laser beam. When the plated layer 13 formed in the part irradiated by the laser beam is employed as a lead wire for an electric circuit or the same is applied only to a necessary region for saving material in noble metal plating, the plated layer 14 in the unirradiated part is unnecessary or even obstructive. Therefore, the plated layer in the said region 14 must be removed by a proper method such as pickling.

As hereinabove described, in the conventional electrolytic plating apparatus, the thinner plated layer is inevitably formed in the undesired region and hence it is required to remove the unnecessary plated layer, whereby the steps in the plating process are increased. Further, insufficient removal of the unnecessary plated layer will result in inferior goods.

SUMMARY OF THE INVENTION

The present invention has been proposed to overcome the aforementioned disadvantage of the prior art.

An object of the present invention is to provide an electrolytic apparatus which can prevent formation of a plated layer in an unnecessary part of a substrate.

Another object of the present invention is to provide an electrolytic apparatus by which highly accurate plating of high quality can be obtained in a plating process.

Still another object of the present invention is to provide an electrolytic apparatus which can reduce the steps in a plating process.

According to the present invention, an electrolytic apparatus for applying voltage between a workpiece and a counter electrode both immersed in an electrolyte contained in a vessel thereby to process the workpiece comprises a voltage source for applying voltage between the workpiece and the counter electrode in the form of pulses whose polarity is periodically changed, a beam generator for generating a beam in the form of periodic pulses for irradiating a subsidiary energy beam on a selected region of the workpiece and a timing controller for synchronizing periods of the voltage pulses and the beam pulses.

These and other objects, features, aspects and advantages of the present invention will become more apparent from the following detailed description of the present invention when taken in conjunction with the accompanying drawings.

BRIEF DESCRIPTION OF THE INVENTION

FIG. 6 is a block diagram showing an embodiment of a timing controller employed in the apparatus shown in FIG. 4;

FIG. 7 is a cross-sectional view illustrating a workpiece plated by the apparatus shown in FIG. 4;

DESCRIPTION OF THE PREFERRED EMBODIMENTS

An embodiment of the present invention is now described with reference to the accompanying drawings.

Figure 4:
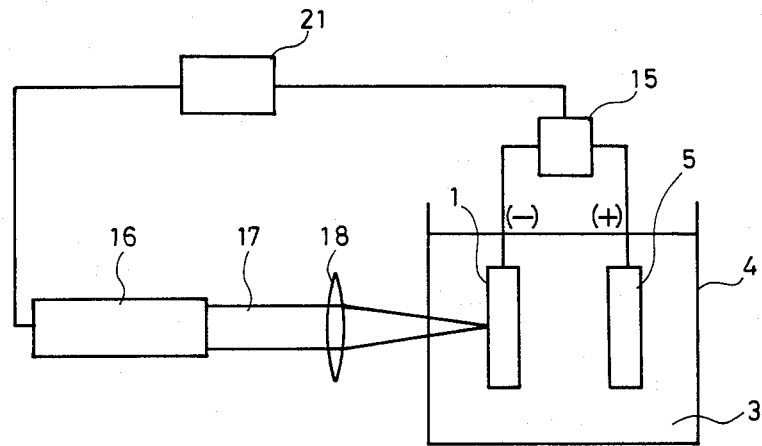
FIG. 4 is a schematic diagram illustrating an embodiment of an electrolytic apparatus according to the present invention.

FIG. 4 is a schematic diagram illustrating structure of an embodiment according to the present invention. In FIG. 4, a workpiece 1 having a metallic surface and a counter electrode 5 are immersed in an electrolyte 3 contained in a vessel 4. The workpiece 1 and the counter electrode 5 are connected with each other through a voltage source 15 which can supply voltage in the form of pulses whose polarity is periodically changed. A laser generator 16 emits a beam 17 in the form of periodic pulses, and a lens 18 is adapted to focus the beam 17 on a predetermined region of the workpiece 1. A timing controller 21 synchronizes the periods of the voltage pulses generated by the voltage source 15 with those of the laser pulses generated from the laser source 16. Structure of the timing controller 21 will be hereinafter described in detail.

Figure 5A:
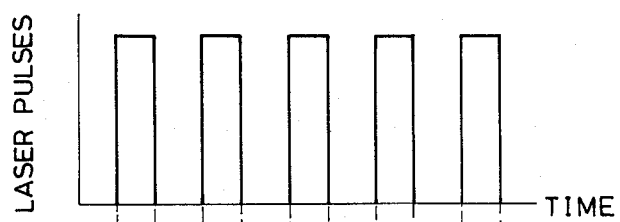
FIG. 5A is a waveform diagram illustrating laser pulses employed in the apparatus shown in FIG. 4.
Figure 5B:
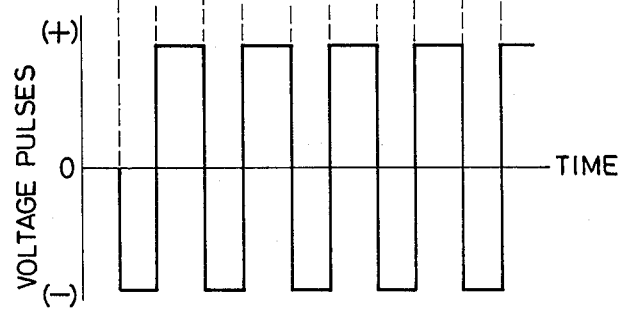
FIG. 5B is a waveform diagram illustrating voltage pulses applied to a workpiece in the apparatus shown in FIG. 4.

FIGS. 5A and 5B respectively show examples of the laser pulses and the voltage pulses synchronized by the timing controller 21. When, for example, the workpiece 1 is to be plated, the workpiece 1 is supplied with a negative potential during each pulse duration of the laser beam and with a positive potential during each pulse spacing of the beam.

FIG. 6 shows an embodiment of the timing controller 21 in further detail. In the timing controller 21, pulse signals generated from a pulse generator 22 are amplified by an amplifier 23 to be supplied to semiconductor switches 24 and 25. The semiconductor switch 24 is adapted to switch the polarity of the voltage source 15 by the pulse signals inputted therein while the other semiconductor switch 25 controls the periods of the laser pulses.

Description is now made on plating operation in the apparatus as shown in FIG. 4. The workpiece 1 immersed in the electrolyte (plating solution) 3 is supplied through the voltage source 15 with the voltage whose polarity is periodically reversed with respect to the counter electrode 5. On the other hand, the beam 17 emitted from the laser generator 16 is focused by the lens 18 on a predetermined region on the surface of the workpiece 1. As shown in FIGS. 5A and 5B, the voltage pulses are synchronized with the laser pulses and hence the plating current is supplied only during each pulse duration of the laser beam alone, and an etching or resolving current is applied to the workpiece 1 during each pulse spacing of the beam. Therefore, during each pulse duration, plating is facilitated in the region irradiated by the laser beam while a thinner plated layer formed in the region unirradiated by the laser beam is removed by electrolytic etching during each beam pulse spacing. The plating deposition rate in the part irradiated by the laser beam is several hundred to several thousand times as high as that of the unirradiated part, and hence, as shown in FIG. 7, a plated layer 13 can be formed on the workpiece 1 by repetition of the aforementioned pulses only in the part irradiated by the laser beam in the final stage.

Figure 8:
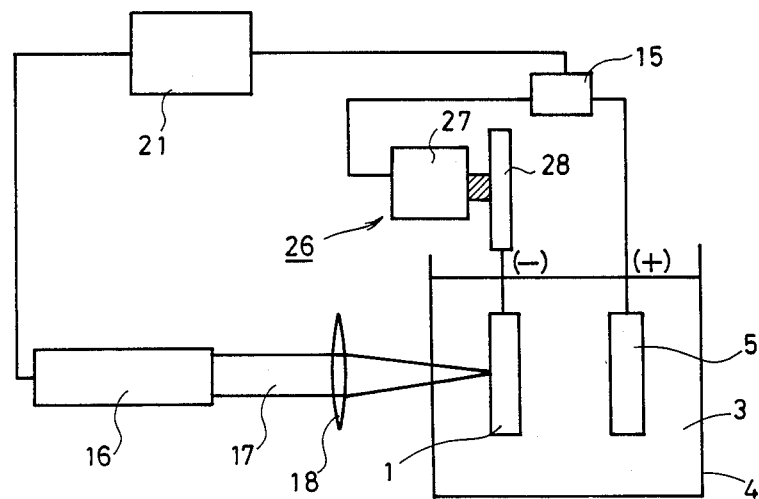
FIG. 8 is a schematic diagram illustrating another embodiment of the present invention.
Figure 9A:
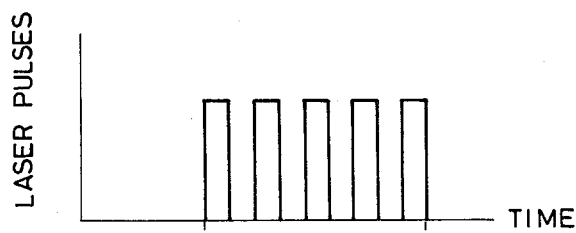
FIG. 9A is a waveform diagram illustrating laser pulses employed in the apparatus shown in FIG. 8.
Figure 9B:
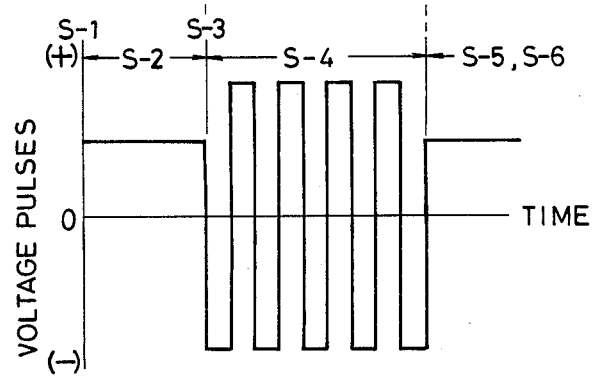
FIG. 9B is a waveform diagram illustrating voltage pulses applied to a workpiece in the apparatus shown in FIG. 8.

FIG. 8 is an illustration showing another embodiment of the present invention. In FIG. 8, numerals identical to those in FIG. 4 indicate the same or corresponding components. A workpiece holder means 26 is adapted to set a workpiece 1 in place in an electrolyte 3, and a voltage source 15' is correlated in operation not only with a timing controller 21 but with the workpiece holder means 26. The workpiece holder means 26 comprises a holder controller 27 and a transfer means 28 having a sensor. The holder controller 27 controls not only the transfer means for transferring and positioning the workpiece 1 but also the voltage source 15'. The sensor of the transfer means is adapted to detect attachment and immersion of the workpiece 1 and comprises a gravity sensor, a limit switch or the like. FIGS. 9A and 9B show relation between the laser pulses and the voltage pulses supplied by the voltage source 15' in the apparatus shown in FIG. 8.

Figure 10:
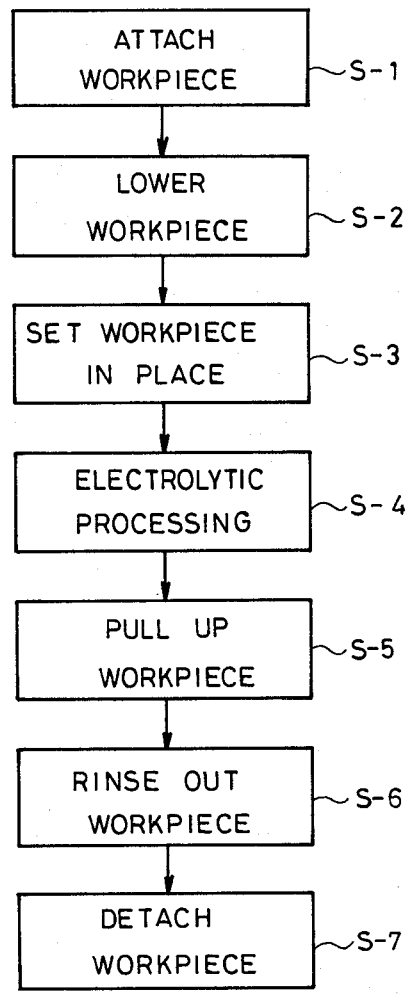
FIG. 10 is a flow chart showing the steps of the process in the apparatus shown in FIG. 8.

Description is now made on operation in FIG. 8 for plating the workpiece 1. FIG. 10 is a flow chart illustrating an example of the plating operation, respective steps of which are correspondingly shown in FIG. 9B. In the step S-1, the workpiece 1 is set on the transfer device 28. The sensor of the transfer device 28 detects this setting of the workpiece 1, so that the holder controller 27 causes the voltage source 15' to apply a prescribed positive potential to the workpiece 1. Then, in the step S-2, the holder controller 27 makes the transfer device 28 lower the workpiece 1. In the step S-3, the sensor of the transfer device 28 detects that the workpiece 1 is lowered in place, so that the holder controller 27 stops the transfer device 28 and causes the voltage source 15' to generate plating voltage pulses. In the step S-4, the plating operation is performed in a similar manner to that in FIG. 4. After a predetermined plating period, the holder controller 27 makes the transfer device 28 start pulling up the workpiece 1 while making the voltage source 15' stop generating the plating voltage pulses thereby to apply a prescribed positive potential to the workpiece 1 in the step S-5. Then, in the step S-6, the raised workpiece 1 is washed by water while being supplied with the positive potential, to be removed, in the step S-7, from the transfer device 28, which detects the removal so that the holder controller 27 stops the voltage source 15'.

As hereinabove described, the workpiece 1 is supplied with the positive potential before and after the plating period of the step S-4, and hence displacement plating is prevented in the preparatory immersing period in the step S-2 as well as the raising and washing periods in the steps S-5 and S-6.

Although each of the aforementioned embodiments has been described with respect to the case where a laser beam is employed, other subsidiary energy beams such as an ultrasonic beam, an electromagnetic radiation beam and a light beam from a xenon lamp may also be employed.

Further, although the foregoing description has been made on the case where a workpiece is plated, such a workpiece may be selectively etched in an appropriate electrolyte. In this case, a workpiece 1 immersed in an etching solution 3 is supplied with a positive potential in synchronization with each pulse duration of the beam while being supplied with a negative potential in synchronization with each pulse spacing of the beam.

Figure 1:
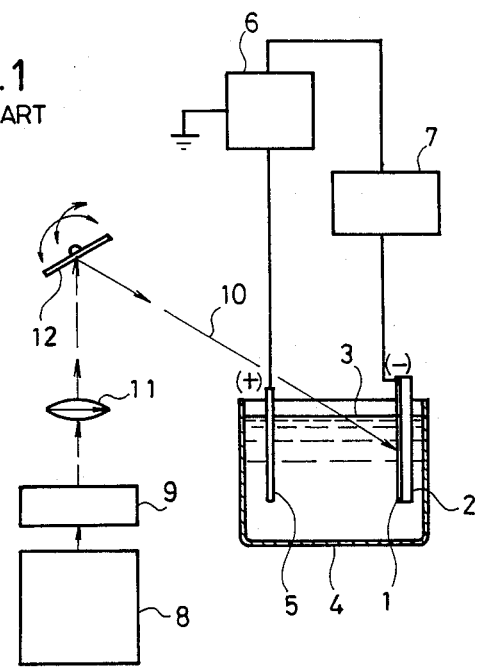
FIG. 1 is a schematic diagram illustrating a conventional electrolytic apparatus.
Figure 2A:
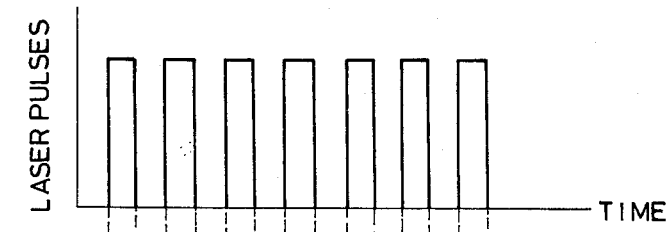
FIG. 2A is a waveform diagram of laser pulses employed in the apparatus shown in FIG. 1.
Figure 2B:
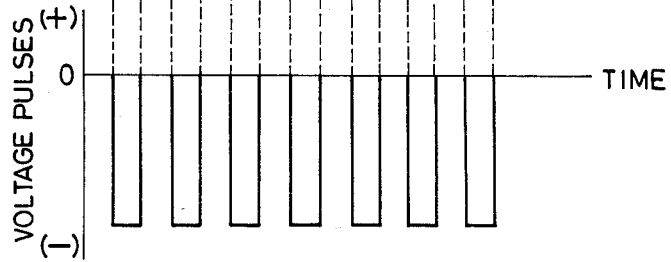
FIG. 2B is a waveform diagram of voltage pulses applied to a cathode in synchronization with the laser pulses in the apparatus shown in FIG. 1.
Figure 3:
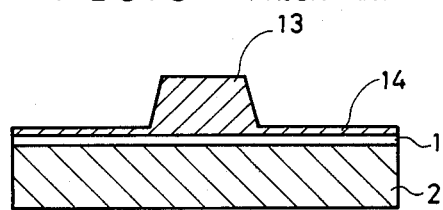
FIG. 3 is a cross-sectional view illustrating portions of a plated layer formed in the apparatus shown in FIG. 1.

In addition, although the laser beam 17 is irradiated through the side wall of the vessel 4 in each of the aforementioned embodiments, the same may be irradiated from above the electrolyte 3 as shown in FIG. 1. When the laser beam 17 is to be irradiated through the side wall of the vessel 4, the vessel 4 may be prepared by material such as glass or acrylics which can transmit the laser beam 17. On the other hand, when the laser beam 17 is to be irradiated from above the electrolyte 3, the vessel 4 may be prepared by ordinary material such as vinyl chloride or Teflon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrolytic apparatus for applying voltage to a workpiece (1) and a counter electrode (5) immersed in an electrolyte (3) contained in a vessel (4) to thereby process said workpiece (1), said electrolytic apparatus comprising:
    a voltage source (15, 15') for applying voltage between said workpiece (1) and said counter electrode (5) in the form of pulses whose polarity is periodically changed;
    a beam generator (16) for irradiating a subsidiary energy beam (17) on a selected region of said workpiece (1) by generating said beam (17) in the form of periodic pulses;
    a timing controller (21) for synchronizing the periods of said voltage pulses and said beam pulses; and
    workpiece holder means (26) for controlling said voltage source (15') so that a voltage of reversed polarity with respect to that supplied during each beam pulse duration may be applied to said workpiece (1) on attachment of the same and then said voltage source (15') may start to generate said voltage pulses and be controlled by said timing controller (21) on setting of said workpiece (1) in place.

2. An electrolytic apparatus in accordance with claim 1, wherein said workpiece holder means (26) causes said voltage source (15') to apply a voltage of reversed polarity with respect to that supplied during each pulse duration of said beam to said workpiece (1) on the end of control by said timing control device (21) while raising said workpiece (1).

3. An electrolytic apparatus in accordance with claim 1, wherein said subsidiary energy beam (17) is a laser beam.

4. An electrolytic apparatus in accordance with claim 3, wherein said laser beam is selected from YAG, argon (Ar) and krypton (Kr) laser beams.

5. An electrolytic apparatus in accordance with claim 1, wherein said subsidiary energy beam (17) is an light beam from a xenon lamp.

6. An electrolytic apparatus in accordance with claim 1, wherein said subsidiary energy beam (17) is an ultrasonic beam.

7. An electrolytic apparatus in accordance with claim 1, wherein said electrolyte (3) is a plating solution.

8. An electrolytic apparatus in accordance with claim 7, wherein said timing controller (21) synchronizes said voltage source (15, 15') and said beam generator (16) so that a negative potential is applied to said workpiece (1) with respect to said counter electrode (5) during each pulse duration of said beam (17) and a positive potential is applied to the same during each spacing between said beam pulses.

9. An electrolytic apparatus in accordance with claim 1, wherein said electrolyte (3) is an etching solution.

10. An electrolytic apparatus in accordance with claim 9, wherein said timing controller (21) synchronizes said voltage source (15, 15') and said beam generator (16) so that a positive potential is applied to said workpiece (1) with respect to said counter electrode (5) during each pulse duration of said beam (17) and a negative potential is applied to the same during each spacing between said beam pulses.

11. A method of applying voltage to a workpiece and a counter electrode immersed in an electrolyte contained in a vessel of an electrolytic apparatus, comprising the steps of:
    (a) applying a voltage between said workpiece and said counter electrode in the form of pulses having a polarity periodically changed;
    (b) irradiating a subsidiary energy beam on a selected region of said workpiece by generating said beam in the form of periodic pulses;
    (c) synchronizing the periods of said voltage pulses and said beam pulses; and
    (d) applying to said workpiece a voltage of reversed polarity with respect to that supplied during each beam pulse duration on attachment of the workpiece to a workpiece holder and then applying said voltage pulses upon setting of said workpiece in said electrolyte.

* * * * *